United States Patent
Shin et al.

(10) Patent No.: US 12,446,409 B2
(45) Date of Patent: Oct. 14, 2025

(54) DISPLAY DEVICE WITH HYDROGEN BLOCKING LAYER TO MINIMIZE DIFFUSION OF HYDROGEN TO TRANSISTOR

(71) Applicant: LG DISPLAY CO., LTD., Seoul (KR)

(72) Inventors: Jungcheol Shin, Seoul (KR); Byungjin Kim, Paju-si (KR); GiSang Hong, Seoul (KR); YoungWook Lee, Paju-si (KR); Jinkwon Park, Seoul (KR)

(73) Assignee: LG Display Co., Ltd (KR)

( * ) Notice: Subject to any disclaimer, the term of this patent is extended or adjusted under 35 U.S.C. 154(b) by 457 days.

(21) Appl. No.: 17/866,931

(22) Filed: Jul. 18, 2022

(65) Prior Publication Data

US 2023/0076860 A1 Mar. 9, 2023

(30) Foreign Application Priority Data

Sep. 3, 2021 (KR) .......................... 10-2021-0117619
Sep. 3, 2021 (KR) .......................... 10-2021-0117622
Dec. 14, 2021 (KR) .......................... 10-2021-0178549

(51) Int. Cl.
*H10K 59/122* (2023.01)
*H10K 50/818* (2023.01)
*H10K 59/123* (2023.01)

(52) U.S. Cl.
CPC ......... *H10K 59/122* (2023.02); *H10K 50/818* (2023.02); *H10K 59/123* (2023.02)

(58) Field of Classification Search
CPC ... H10K 59/122; H10K 50/818; H10K 59/123

USPC .......................................................... 257/40
See application file for complete search history.

(56) References Cited

U.S. PATENT DOCUMENTS

| | | | |
|---|---|---|---|
| 2012/0223346 A1* | 9/2012 | Ohsawa | H10K 50/11 257/89 |
| 2017/0125740 A1* | 5/2017 | Lee | H10K 59/877 |
| 2020/0194509 A1* | 6/2020 | Beak | H10K 59/878 |
| 2021/0132723 A1 | 5/2021 | Kim et al. | |
| 2021/0202910 A1 | 7/2021 | Lee | |

FOREIGN PATENT DOCUMENTS

| | | |
|---|---|---|
| CN | 103887440 A | 6/2014 |
| CN | 111326546 A | 6/2020 |
| CN | 112783360 A | 5/2021 |
| CN | 113130658 A | 7/2021 |

(Continued)

OTHER PUBLICATIONS

Office Action in Chinese Appln. No. 202210915114.3, mailed on Jul. 17, 2025, 11 pages (with English translation).

*Primary Examiner* — Xia L Cross
(74) *Attorney, Agent, or Firm* — Fish & Richardson P.C.

(57) ABSTRACT

A display device includes a substrate including a display area and a non-display area; a first overcoating layer disposed on the substrate and including a base portion and a protruding portion protruding from the base portion; a first hydrogen blocking layer disposed on a top surface of the protruding portion in the display area; a first electrode covering the base portion and the first hydrogen blocking layer; a bank disposed on a part of the first electrode; an organic layer disposed on the first electrode and the bank; and a second electrode disposed on the organic layer.

20 Claims, 11 Drawing Sheets

(56) References Cited

FOREIGN PATENT DOCUMENTS

| KR | 10-0787461 B1 | 12/2007 |
| KR | 10-2014-0081655 A | 7/2014 |
| KR | 10-2021-0070132 A | 6/2021 |

* cited by examiner

DISPLAY DEVICE WITH HYDROGEN BLOCKING LAYER TO MINIMIZE DIFFUSION OF HYDROGEN TO TRANSISTOR

CROSS-REFERENCE TO RELATED APPLICATION

This application claims the priorities of Korean Patent Application No. 10-2021-0117619 filed on Sep. 3, 2021, Korean Patent Application No. 10-2021-0117622 filed on Sep. 3, 2021, and Korean Patent Application No. 10-2021-0178549 filed on Dec. 14, 2021, which are hereby incorporated by reference in their entirety.

BACKGROUND

Field of the Disclosure

The present disclosure relates to a display device, and more particularly, to a display device capable of preventing degradation by improving reliability of a transistor.

Description of the Background

Recently, display devices, which visually display electrical information signals, are being rapidly developed in accordance with the full-fledged entry into the information era. Various studies are being continuously conducted to develop a variety of display devices which are thin and lightweight, consume low power, and have improved performance.

Among the various display devices, a light-emitting display device refers to a display device that autonomously emits light. Unlike a liquid crystal display device, the light-emitting display device does not require a separate light source and thus may be manufactured as a lightweight, thin display device. In addition, the light-emitting display device is advantageous in terms of power consumption because the light-emitting display device operates at a low voltage. Further, the light-emitting display device is expected to be adopted in various fields because the light-emitting display device is also excellent in implementation of colors, response speeds, viewing angles, and contrast ratios (CRs).

SUMMARY

Accordingly, the present disclosure is to provide a display device capable of preventing diffusion of hydrogen generated from an encapsulation unit.

The present disclosure is also to provide a display device capable of preventing degradation by improving reliability of a transistor.

The present disclosure is also to provide a display device with improved light extraction efficiency.

The present disclosure is also to provide a display device capable of reducing material costs and simplifying a process of manufacturing an overcoating layer.

The present disclosure are not limited to the above-mentioned features, and other features, which are not mentioned above, can be clearly understood by those skilled in the art from the following descriptions.

According to an aspect of the present disclosure, a display device includes: a substrate including a display area and a non-display area; a first overcoating layer on the substrate and including a base portion and a protruding portion; a first hydrogen blocking layer on a top surface of the protruding portion in the display area; a first electrode covering the base portion and the first hydrogen blocking layer; a bank on a part of the first electrode; an organic layer on the first electrode and the bank; and a second electrode on the organic layer.

Other detailed matters of the exemplary aspects are included in the detailed description and the drawings.

According to the present disclosure, the hydrogen blocking layer may minimize diffusion of hydrogen to the transistor.

The present disclosure may improve quality of the display device by preventing degradation of the transistor.

The present disclosure may improve light extraction efficiency of the display device.

The present disclosure may reduce process costs by reducing the number of overcoating layers.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
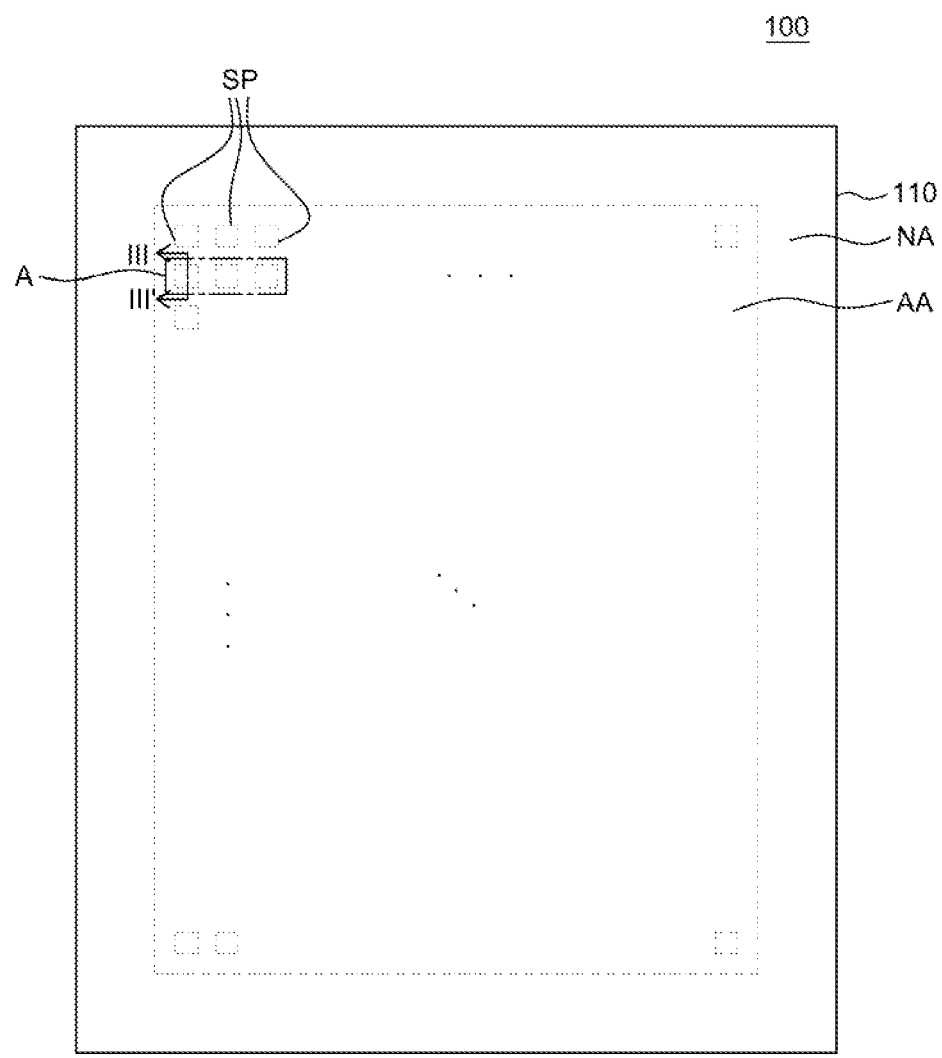
FIG. 1 is a top plan view of a display device according to an aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Hereinafter, the present disclosure will be described in detail with reference to accompanying drawings.

FIG. 1 is a top plan view of a display device according to an aspect of the present disclosure.

Referring to FIG. 1, a display device 100 according to an aspect of the present disclosure includes a display area AA and a non-display area NA.

The display area AA may be disposed at a central portion of a substrate 110. The display area AA may be an area of the display device 100 in which images are displayed. Various display elements and various driving elements for operating the display elements may be disposed in the display area AA. For example, the display element may be configured as a light-emitting element 170 including a first electrode 171, an organic layer 172, and a second electrode 173 which will be described below. In addition, various driving elements such as a first transistor 130, a capacitor, wires, and the like, which are configured to operate the display elements, may be disposed in the display area AA.

A plurality of subpixels SP may be included in the display area AA. The subpixel SP is a minimum unit that constitutes a screen. The plurality of subpixels SP may each include the light-emitting element 170 and a drive circuit. The plurality of subpixels SP may each be defined as an area in which a plurality of gate lines disposed in a first direction and a plurality of data lines disposed in a second direction different from the first direction intersect each other. In this case, the first direction may be a horizontal direction based on FIG. 1, and the second direction may be a vertical direction based on FIG. 1. However, the present disclosure is not limited thereto. The plurality of subpixels SP may emit light beams having different wavelengths. For example, the plurality of subpixels SP may include red subpixels, green subpixels, and blue subpixels. In addition, the plurality of subpixels SP may further include white subpixels.

The drive circuit of the subpixel SP is a circuit for controlling an operation of the light-emitting element 170. For example, the drive circuit may include a switching transistor, a driving transistor, a capacitor, and the like. The drive circuit may be electrically connected to signal lines such as gate lines and data lines connected to gate drivers and data drivers disposed in the non-display area NA.

The non-display area NA may be disposed in a peripheral area of the substrate 110. The non-display area NA may be an area in which no image is displayed. The non-display area NA may be disposed to surround the display area AA, but the present disclosure is not limited thereto. Various constituent elements for operating the plurality of subpixels SP disposed in the display area AA may be disposed in the non-display area NA. For example, drive ICs, drive circuits, signal lines, flexible films, and the like, which are configured to supply signals for operating the plurality of subpixels SP, may be disposed. In this case, the drive IC may include a gate driver, a data driver, and the like.

Figure 2:
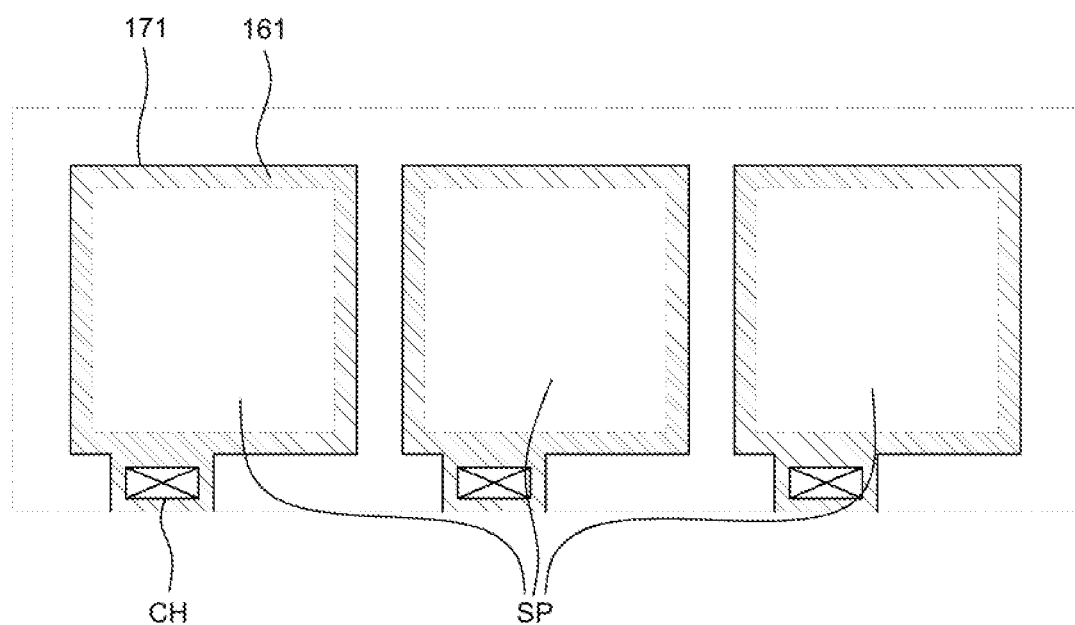
FIG. 2 is an enlarged top plan view of area A in FIG. 1.
Figure 3:
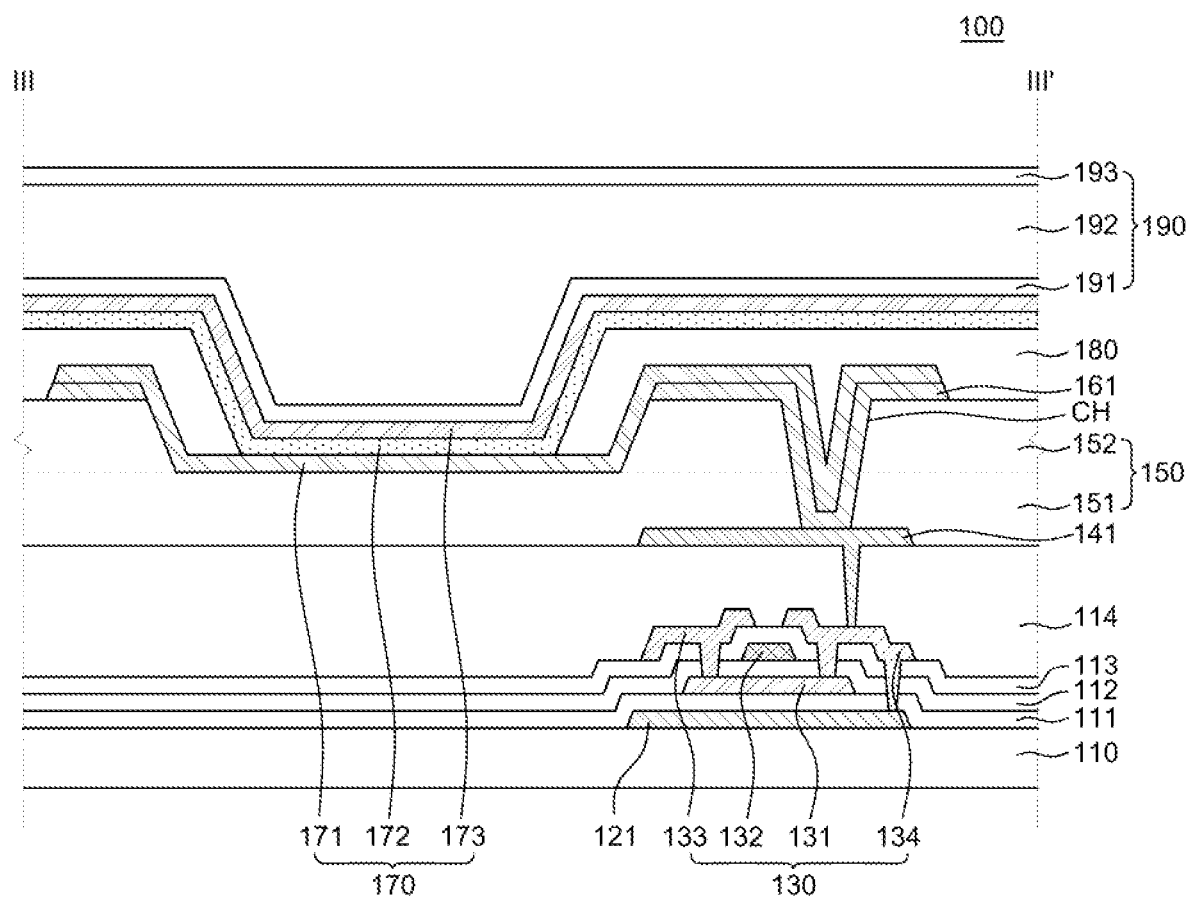
FIG. 3 is a cross-sectional view of the display device taken along line in FIG. 1.

FIG. 2 is an enlarged top plan view of area A in FIG. 1. FIG. 3 is a cross-sectional view of the display device taken along line in FIG. 1. FIG. 2 schematically illustrates only the plurality of subpixels SP, a first hydrogen blocking layer 161, the first electrode 171, and a contact hole CH.

Referring to FIG. 3, the display device 100 includes the substrate 110, a protective layer 121, the first transistor 130, an auxiliary electrode 141, overcoating layers 150 and 114, the first hydrogen blocking layer 161, the light-emitting element 170, a bank 180, and an encapsulation unit 190. The display device 100 may be implemented as a top-emission type display device, but the present disclosure is not limited thereto.

The substrate 110 is a substrate configured to support and protect several constituent elements of the display device 100. The substrate 110 may be made of glass or a plastic material having flexibility. In the case in which the substrate 110 is made of a plastic material, the substrate 110 may be made of polyimide (PI), for example. However, the present disclosure is not limited thereto.

The protective layer 121 is disposed on the substrate 110. The protective layer 121 may be disposed to overlap the first transistor 130. The protective layer 121 may be made of a metallic material and electrically connected to a source electrode 133 or a drain electrode 134 of the first transistor 130. However, the present disclosure is not limited thereto. For example, the protective layer 121 may be made of molybdenum (Mo) and electrically connected to the drain electrode 134. However, the present disclosure is not limited thereto. The protective layer 121 may be selectively formed only in a necessary area. For example, the protective layer 121 may be disposed to overlap the first transistor 130 that is a driving transistor. However, the present disclosure is not limited thereto.

The protective layer 121 may suppress the occurrence of potential on a surface of the substrate 110 and block an inflow of light from the outside. Specifically, in a case in which the substrate 110 is made of a plastic material, a separate support substrate is attached to a lower portion of the substrate 110 to support the substrate 110 during the manufacturing process. In this case, a sacrificial layer is disposed between the substrate 110 and the support substrate. When the manufacturing process is completed, the substrate 110 and the support substrate may be separated by a laser release process. An active layer 131 of the first transistor 130 disposed on the substrate 110 may be damaged by laser beams emitted during the laser release process.

In addition, sensor using infrared rays or the like may be disposed under the display device 100. Therefore, the active layer 131 may be degraded by light generated from the sensor.

In addition, a threshold voltage (Vth) of the first transistor 130 may be shifted because of an electric current drop generated by the substrate 110 and the sacrificial layer. Specifically, a negative charge trap may occur on the sacrificial layer because of laser beams and light introduced from the outside. Further, positive (+) charges in the plastic material, for example, polyimide (PI), which is a material of the substrate 110, may move toward the sacrificial layer. Therefore, potential on the surface of the substrate 110 may increase. As a result, the threshold voltage of the first transistor 130 is shifted in a positive direction, and the current flowing through the first transistor 130 may decrease. The shift of the threshold voltage deteriorates reliability of the display device 100.

Therefore, the substrate 110 may produce heat when the display device 100 operates after the laser release process. As a result, charged particles generated on the substrate 110 move upward. The charged particles affect the active layer 131 of the first transistor 130, which may degrade reliability of the display device 100.

Therefore, the protective layer 121 may be disposed under the first transistor 130. In this case, the protective layer 121 may overlap the active layer 131. In particular, the protective layer 121 may be disposed to overlap a channel area of the active layer 131. The protective layer 121 may prevent the channel area from being degraded by the emitted light. In addition, the protective layer 121 may protect the first transistor 130 from the charged particles generated on the substrate 110 and minimize the influence on the electric charges flowing through a channel of the first transistor 130. Therefore, it is possible to prevent the shift of threshold voltage and the current drop of the first transistor 130 and improve reliability of the display device 100.

Since the protective layer 121 is made of a metallic material, the protective layer 121 and the active layer 131 may be elements for forming capacitance in some instances. In this case, when the protective layer 121 electrically floats, the parasitic capacitance may be changed, and the amount of shift of threshold voltage of the first transistor 130 may be diversified. This may cause a visual defect such as a change in brightness. Therefore, since the protective layer 121 is electrically connected to the source electrode 133 or the drain electrode 134, the parasitic capacitance may be kept constant. That is, the protective layer 121 may be supplied with the same voltage as the source electrode 133 or the drain electrode 134.

Meanwhile, in the drawings, the protective layer 121 is illustrated as being disposed under the first transistor 130 that is a driving transistor. However, the present disclosure is not limited thereto. The protective layer 121 may also be disposed under a transistor different from the driving transistor.

A buffer layer 111 is disposed on the substrate 110 and the protective layer 121. The buffer layer 111 may reduce the amount of moisture or impurities penetrating through the substrate 110. In addition, the buffer layer 111 may protect the first transistor 130 from impurities such as alkaline ions flowing out of the substrate 110. Therefore, the buffer layer 111 may improve bonding forces between the substrate 110 and the layers formed on an upper portion of the buffer layer 111. The buffer layer 111 may be configured as a single layer made of silicon nitride (SiNx) or silicon oxide (SiOx) or a multilayer made of silicon nitride (SiNx) or silicon oxide (SiOx). However, the present disclosure is not limited thereto. The buffer layer 111 is not an essential constituent element. The buffer layer 111 may be eliminated depending on the type and material of the substrate 110, the structure and type of the first transistor 130, and the like. Meanwhile, the buffer layer may also be disposed between the substrate 110 and the protective layer 121 in some instances.

The first transistor 130 is disposed on the buffer layer 111. The first transistor 130 may be used as a driving element for operating the light-emitting element 170 in the display area AA. The first transistor 130 includes the active layer 131, a gate electrode 132, the source electrode 133, and the drain electrode 134. The first transistor 130 illustrated in FIG. 3 is a driving transistor. The first transistor 130 is a thin-film transistor having a top-gate structure in which the gate electrode 132 is disposed on the active layer 131. However, the present disclosure is not limited thereto. The first transistor 130 may be implemented as a transistor having a bottom-gate structure.

FIG. 3 illustrates only the driving transistor 130 among various transistors included in the display device 100. However, the other transistors such as a switching transistor may be disposed.

Meanwhile, according to the display device 100 according to the aspect of the present disclosure, at least two types of thin-film transistors may be formed on the same substrate 110. In this case, an LTPS thin-film transistor and an oxide semiconductor thin-film transistor are used as the at least two types of thin-film transistors. The LTPS thin-film transistor may be a thin-film transistor that uses low-temperature polysilicon (LTPS) as the active layer. The oxide semiconductor thin-film transistor may be a thin-film transistor that uses an oxide semiconductor material as the active layer. The display device 100 according to the present disclosure may provide an optimal function as the LPTS thin-film transistor and the oxide semiconductor thin-film transistor, which have different properties, are disposed on the same substrate. FIG. 3 illustrates only the first transistor 130 that is a driving transistor. The present disclosure will be described with reference to the configuration in which the first transistor 130 is the oxide semiconductor thin-film transistor. In this case, the display device 100 may include both the LPTS thin-film transistor and the oxide semiconductor thin-film transistor as described above. The display device 100 may include only the oxide semiconductor thin-film transistor.

The active layer 131 is disposed on the buffer layer 111. The active layer 131 is an area in which a channel is formed when the first transistor 130 operates. Since the first transistor 130 is the oxide semiconductor thin-film transistor, the active layer 131 may be made of an oxide semiconductor. However, in the case in which the first transistor 130 is the LTPS thin-film transistor, the active layer may be made of low-temperature polysilicon.

A gate insulating layer 112 is disposed on the active layer 131. The gate insulating layer 112 is a layer for electrically insulating the active layer 131 and the gate electrode 132. The gate insulating layer 112 may be made of an insulating material. For example, the gate insulating layer 112 may be configured as a single layer made of silicon nitride (SiNx) or silicon oxide (SiOx) that is an inorganic material. Alternatively, the gate insulating layer 112 may be configured as a multilayer made of silicon nitride (SiNx) or silicon oxide (SiOx). However, the present disclosure is not limited thereto.

The gate insulating layer 112 has contact holes through which the source electrode 133 and the drain electrode 134 are in contact with a source area and a drain area of the active layer 131, respectively. As illustrated in FIG. 3, the gate insulating layer 112 may be formed over the entire surface of the substrate 110 or patterned to have the same width as the gate electrode 132. However, the present disclosure is not limited thereto.

The gate electrode 132 is disposed on the gate insulating layer 112. The gate electrode 132 is disposed on the gate insulating layer 112 and overlaps the channel area of the active layer 131. The gate electrode 132 may be made of any one of various metallic materials, for example, molybdenum (Mo), aluminum (Al), chromium (Cr), gold (Au), titanium (Ti), nickel (Ni), neodymium (Nd), copper (Cu), and an alloy of two or more of these metallic materials. Alternatively, the gate electrode 132 may be configured as a multilayer made of various metallic materials, for example, molybdenum (Mo), aluminum (Al), chromium (Cr), gold (Au), titanium (Ti), nickel (Ni), neodymium (Nd), copper (Cu), and an alloy of two or more of these metallic materials. However, the present disclosure is not limited thereto.

An interlayer insulating layer 113 is disposed on the gate electrode 132. The interlayer insulating layer 113 may be configured as a single layer made of silicon nitride (SiNx) or silicon oxide (SiOx) that is an inorganic material. Alternatively, the interlayer insulating layer 113 may be configured as a multilayer made of silicon nitride (SiNx) or silicon oxide (SiOx). However, the present disclosure is not limited thereto. The interlayer insulating layer 113 has contact holes through which the source electrode 133 and the drain electrode 134 are in contact with the source area and the drain area of the active layer 131, respectively.

The source electrode 133 and the drain electrode 134 are disposed on the interlayer insulating layer 113. The source electrode 133 and the drain electrode 134 are disposed on the same layer and spaced apart from each other. The source electrode 133 and the drain electrode 134 are electrically connected to the active layer 131 through the contact holes of the gate insulating layer 112 and the contact holes of the interlayer insulating layer 113. The source electrode 133 and the drain electrode 134 may each be made of any one of various metallic materials, for example, molybdenum (Mo), aluminum (Al), chromium (Cr), gold (Au), titanium (Ti), nickel (Ni), neodymium (Nd), copper (Cu), and an alloy of two or more of these metallic materials. Alternatively, the source electrode 133 and the drain electrode 134 may each be configured as a multilayer made of various metallic materials, for example, molybdenum (Mo), aluminum (Al), chromium (Cr), gold (Au), titanium (Ti), nickel (Ni), neodymium (Nd), copper (Cu), and an alloy of two or more of these metallic materials. However, the present disclosure is not limited thereto.

The overcoating layers 114 and 150 are disposed on the interlayer insulating layer 113 and the first transistor 130. The overcoating layers 114 and 150 may include the first overcoating layer 150 and the second overcoating layer 114. The overcoating layers 114 and 150 may each be made of any one of acrylic resin, epoxy resin, phenolic resin, polyamide-based resin, polyimide-based resin, unsaturated polyester-based resin, polyphenylene-based resin, polyphenylene sulfide-based resin, benzocyclobutene, and photoresist. However, the present disclosure is not limited thereto.

The second overcoating layer 114 is disposed on the first transistor 130. The second overcoating layer 114 is an insulating layer that serves to protect the first transistor 130 and flatten an upper portion of the first transistor 130. The second overcoating layer 114 has a contact hole through which the drain electrode 134 of the first transistor 130 is exposed. FIG. 3 illustrates that the contact hole is formed in the second overcoating layer 114 in order to expose the drain electrode 134. However, the present disclosure is not limited thereto. For example, the second overcoating layer 114 may have a contact hole through which the source electrode 133 is exposed.

Meanwhile, a passivation layer may be further disposed under the second overcoating layer 114 and cover the interlayer insulating layer 113 and the first transistor 130. The passivation layer may be configured as a single layer made of silicon nitride (SiNx) or silicon oxide (SiOx) or a multilayer made of silicon nitride (SiNx) or silicon oxide (SiOx). However, the present disclosure is not limited thereto.

The auxiliary electrode 141 is disposed on the second overcoating layer 114. The auxiliary electrode 141 serves to electrically connect the first transistor 130 and the light-emitting element 170. The auxiliary electrode 141 is electrically connected to the drain electrode 134 of the first transistor 130 through the contact hole formed in the second overcoating layer 114. The auxiliary electrode 141 may be configured as a single layer or multilayer made of any one of molybdenum (Mo), copper (Cu), titanium (Ti), aluminum (Al), chromium (Cr), gold (Au), nickel (Ni), neodymium (Nd), and an alloy thereof The first overcoating layer 150 is disposed on the second overcoating layer 114. The first overcoating layer 150 is an insulating layer that serves to flatten an upper portion of the second overcoating layer 114 and an upper portion of the auxiliary electrode 141. The first overcoating layer 150 has a contact hole CH through which the auxiliary electrode 141 is exposed. The first overcoating layer 150 includes a base portion 151 and a protruding portion 152. The base portion 151 and the protruding portion 152 may be integrated with each other. For example, the base portion 151 and the protruding portion 152 may be made of the same material and formed through the same process, for example, the same mask process. However, the present disclosure is not limited thereto.

The base portion 151 is disposed on the second overcoating layer 114. A top surface of the base portion 151 is a surface parallel to the substrate 110. Therefore, the base portion 151 may eliminate a level difference that may occur because of a constituent element disposed at a lower portion of the base portion 151. A part of the top surface of the base portion 151 may be exposed by the protruding portion 152. The light-emitting element 170 may be disposed in the exposed area of the base portion 151.

The protruding portion 152 is disposed on the base portion 151. The protruding portion 152 is integrated with the base portion 151 and has a shape protruding from the base portion 151. That is, the protruding portion 152 is disposed to protrude from an area of the base portion 151, except for the area in which the light-emitting element 170 is to be disposed. The protruding portion 152 may have a shape having a top surface smaller than a bottom surface. However, the present disclosure is not limited thereto.

The protruding portion 152 includes the top surface and a side surface. The top surface of the protruding portion 152 is a surface positioned at an uppermost side of the protruding portion 152. The top surface of the protruding portion 152 may be a surface substantially parallel to the base portion 151 or the substrate 110. The side surface of the protruding portion 152 may be a surface that connects the top surface of the protruding portion 152 and the base portion 151. The side surface of the protruding portion 152 may have a shape inclined from the top surface toward the base portion 151.

The first hydrogen blocking layer 161 is disposed on the protruding portion 152. Specifically, the first hydrogen blocking layer 161 may be disposed on the top surface of the protruding portion 152. That is, the first hydrogen blocking layer 161 is not disposed on the top surface of the base portion 151 on which the light-emitting element 170 is formed. The first hydrogen blocking layer 161 may be disposed to surround the top surface of the base portion 151 exposed by the protruding portion 152. The first hydrogen blocking layer 161 may also be disposed in the contact hole CH formed in the first overcoating layer 150. Therefore, the first hydrogen blocking layer 161 may electrically connect the auxiliary electrode 141 and the first electrode 171.

The first hydrogen blocking layer 161 may be made of a metallic material capable of blocking diffusion of hydrogen. For example, the first hydrogen blocking layer 161 may be made of titanium (Ti). Specifically, titanium has properties capable of trapping hydrogen when titanium meets hydrogen. In addition, the first hydrogen blocking layer 161 may be disposed to completely cover the first transistor 130. Therefore, the first hydrogen blocking layer 161 may prevent diffusion of hydrogen produced from the encapsulation unit 190 and minimize degradation of the first transistor 130 caused by hydrogen.

In particular, referring to FIG. 2, the first hydrogen blocking layer 161 and the first electrode 171 may be patterned to correspond to each of the plurality of subpixels SP. In this case, the first hydrogen blocking layer 161 may be disposed at a lower portion of the first electrode 171 and electrically connected to the first electrode 171. The first hydrogen blocking layer 161 may be disposed in a shape of a closed loop so as to contact an edge of the first electrode 171. The first hydrogen blocking layer 161 may prevent hydrogen produced from the encapsulation unit 190 from being diffused to the first transistor 130. Meanwhile, in FIG. 2, a central area of the first electrode 171, which does not overlap the first hydrogen blocking layer 161, may be a light-emitting area in which the light-emitting element 170 is formed, and light is substantially emitted. That is, the first hydrogen blocking layer 161 is disposed to surround the light-emitting area and may not overlap the light-emitting area.

The light-emitting element 170 is disposed on the first overcoating layer 150. The light-emitting element 170 includes: the first electrode 171 electrically connected to the drain electrode 134 of the first transistor 130; the organic layer 172 disposed on the first electrode 171; and the second electrode 173 formed on the organic layer 172.

The first electrode 171 is disposed to correspond to each of the plurality of subpixels SP. The first electrode 171 is disposed to cover the base portion 141, the protruding portion 152, and the first hydrogen blocking layer 161. Specifically, the first electrode 171 may be disposed on the top surface of the first base portion 151 on which the protruding portion 152 is not disposed. The first electrode 171 may be disposed on the side surface of the protruding portion 152 and the top surface of the first hydrogen blocking layer 161. That is, the first electrode 171 is disposed along a shape of the base portion 151 and a shape of the protruding portion 152. In addition, the first electrode 171 may also be formed in a partial area of the top surface of the protruding portion 152.

The first electrode 171 may be an anode of the light-emitting element 170. The first electrode 171 may be electrically connected to the auxiliary electrode 141 and the drain electrode 134 of the first transistor 130 through the first hydrogen blocking layer 161. However, the first electrode 171 may be electrically connected to the source electrode 133 of the first transistor 130 depending on the type of the first transistor 130, a method of designing the drive circuit, and the like.

FIG. 3 illustrates that the first electrode 171 is configured as a single layer. However, the first electrode 171 may be configured as a multilayer. For example, the first electrode 171 may include: a reflective layer configured to reflect the light emitted from the organic layer 172 toward the second electrode 173; and a transparent conductive layer configured to supply positive holes to the organic layer 172.

The reflective layer may be disposed on the first overcoating layer 150 and the first hydrogen blocking layer 161 and reflect upward the light emitted from the light-emitting element 170. The light emitted from the organic layer 172 of the light-emitting element 170 may not only propagate upward, but also propagate laterally. The light emitted laterally may propagate into the display device 100 and be trapped in the display device 100 by being totally reflected. Further, the light may extinct after propagating into the display device 100. Therefore, the reflective layer is disposed at a lower portion of the organic layer 172 and disposed to cover a lateral portion of the protruding portion 152. The reflective layer may change a propagation direction of the light propagating toward the lateral portion of the organic layer 172 to a forward direction.

The reflective layer may be made of a metallic material. For example, the reflective layer may be made of a metallic material such as aluminum (Al), silver (Ag), copper (Cu), or magnesium-silver alloy (Mg:Ag). However, the present disclosure is not limited thereto.

The transparent conductive layer is disposed on the reflective layer. The transparent conductive layer may be made of an electrically conductive material with a high work function in order to supply the positive holes to the organic layer 172. For example, the transparent conductive layer may be made of transparent conductive oxide based on indium tin oxide (ITO), indium zinc oxide (IZO), indium tin zinc oxide (ITZO), zinc oxide (ZnO), and tin oxide (TO). However, the present disclosure is not limited thereto.

The bank 180 is disposed on the first overcoating layer 150 and the first electrode 171. The bank 180 may cover a part of the first electrode 171 and define a light-emitting area and a non-light-emitting area. The light-emitting area may mean an area in which light is substantially emitted by the organic layer 172 in each of the plurality of subpixels SP. The bank 180 is not disposed in the light-emitting area. The organic layer 172 may be positioned directly on the first electrode 171 and emit light. The non-light-emitting area may mean an area in which no light is emitted. However, the non-light-emitting area may include a light reflection area in which no light is emitted, but the light is reflected so that the light is extracted forward. The light reflection area may be an area corresponding to the inclined surface that is the side surface of the protruding portion 152. In the light reflection area, the light emitted laterally from the light-emitting element 170 may be extracted forward by the first electrode 171 disposed along the inclined surface of the protruding portion 152.

The bank 180 may be made of an organic material. For example, the bank 180 may be made of polyimide resin, acrylic resin, or benzocyclobutene resin. However, the present disclosure is not limited thereto.

The organic layer 172 is disposed on the first electrode 171 and the bank 180. For example, the organic layer 172 is disposed on the first electrode 171 in the light-emitting area and disposed on the bank 180 in the non-light-emitting area. The organic layer 172 may be disposed along a shape of the first electrode 171 and a shape of the bank 180. The organic layer 172 includes a light-emitting layer and a common layer.

The light-emitting layer is an organic layer configured to emit light with a particular color. Different light-emitting layers may be disposed in the plurality of subpixels SP, respectively. The identical light-emitting layers may be disposed in the entire plurality of subpixels SP. For example, in the case in which the different light-emitting layers are disposed in the plurality of subpixels SP, respectively, a red light-emitting layer may be disposed in a red subpixel, a green light-emitting layer may be disposed in a green subpixel, and a blue light-emitting layer may be disposed in a blue subpixel. In the case in which the identical light-emitting layers are disposed in the entire plurality of subpixels SP, the light emitted from the light-emitting layer may be converted into the light with various colors by a separate optical conversion layer, a color filter, or the like.

The common layer is an organic layer disposed to improve luminous efficiency of the light-emitting layer. The identical common layers may be formed over the plurality of subpixels SP. That is, the common layers of the plurality of subpixels SP may be made of the same material and simultaneously formed through the same process. The common layer may include a positive hole injecting layer, a positive hole transporting layer, an electron transporting layer, an electron injecting layer, a charge generating layer, and the like. However, the present disclosure is not limited thereto.

The second electrode 173 is disposed on the organic layer 172. The second electrode 173 may be disposed along a shape of the organic layer 172. Since the second electrode 173 supplies the electrons to the organic layer 172, the second electrode 173 may be made of an electrically conductive material with a low work function. The second electrode 173 may be a cathode of the light-emitting element 170. The second electrode 173 may be made of a transparent electrically conductive material such as indium tin oxide (ITO) and indium zinc oxide (IZO) or made of a metal alloy such as MgAg or an ytterbium (Yb) alloy. The second electrode 173 may further include a metal doping layer. However, the present disclosure is not limited thereto.

The encapsulation unit 190 is disposed on the light-emitting element 170. For example, the encapsulation unit 190 is disposed on the second electrode 173 and covers the light-emitting element 170. The encapsulation unit 190 protects the light-emitting element 170 from moisture and oxygen that penetrate into the display device 100 from the outside. The encapsulation unit 190 may have a structure in which inorganic layers and organic layers are alternately stacked. The encapsulation unit 190 includes a first encapsulation layer 191, a foreign material cover layer 192, and a second encapsulation layer 193.

The first encapsulation layer 191 may be disposed on the second electrode 173 and prevent penetration of moisture or oxygen. The first encapsulation layer 191 may be made of an inorganic material such as silicon nitride ($SiN_x$), silicon oxynitride ($SiN_xO_y$), silicon oxide ($SiO_x$) and aluminum oxide ($Al_yO_z$). However, the present disclosure is not limited thereto.

The foreign material cover layer 192 is disposed on the first encapsulation layer 191 and flattens a surface of the first encapsulation layer 191. In addition, the foreign material cover layer 192 may cover foreign materials or particles that may be produced during the manufacturing process. The foreign material cover layer 192 may be made of an organic material, for example, silicon oxycarbon ($SiO_xC_z$) or acrylic or epoxy-based resin. However, the present disclosure is not limited thereto.

The second encapsulation layer 193 may be disposed on the foreign material cover layer 192 and prevent penetration of moisture or oxygen, like the first encapsulation layer 191. The second encapsulation layer 193 may be made of an inorganic material such as silicon nitride ($SiN_x$), silicon oxynitride ($SiN_xO_y$), silicon oxide ($SiO_x$) and aluminum oxide ($Al_yO_z$). However, the present disclosure is not limited thereto. The second encapsulation layer 193 may be made of the same material as the first encapsulation layer 191. Alternatively, the second encapsulation layer 193 may be made of a material different from a material of the first encapsulation layer 191.

In the case in which the inorganic layer is included in the encapsulation unit, a large amount of hydrogen (H2) is produced during the manufacturing process. Therefore, the inorganic layer of the encapsulation unit contains a large amount of hydrogen. The hydrogen in the inorganic layer of the encapsulation unit may be diffused to another area of the display device over time. When the hydrogen in the inorganic layer of the encapsulation unit penetrates into the transistor including the active layer made of an oxide semiconductor, characteristics of the transistor are changed. Specifically, the threshold voltage (Vth) of the transistor is shifted in a negative direction, which may cause degradation of the transistor. In particular, the oxide semiconductor has properties more vulnerable to hydrogen. Therefore, there is a problem in that the display device including the oxide semiconductor thin-film transistor is more vulnerable to degradation and defects of the transistor caused by hydrogen, and the quality and reliability of the display device deteriorate.

Therefore, the display device 100 according to the aspect of the present disclosure may include the first hydrogen blocking layer 161, thereby the diffusion of hydrogen to the first transistor 130 may be minimized. In particular, the first hydrogen blocking layer 161 may be made of titanium having hydrogen trapping properties. Therefore, the diffusion of hydrogen, which is diffused from the first encapsulation layer 191 and the second encapsulation layer 193 of the encapsulation unit 190, may be blocked by titanium of the first hydrogen blocking layer 161. Therefore, the penetration of hydrogen into the first transistor 130 may be minimized, the degradation of the first transistor 130 may be suppressed, and the reliability of the display device 100 may be improved.

In addition, not only the first hydrogen blocking layer 161, but also the auxiliary electrode 141 may include titanium. That is, the auxiliary electrode 141 may be disposed to completely cover the first transistor 130 and serve as a hydrogen blocking layer. In this case, the first hydrogen blocking layer 161 and the auxiliary electrode 141 may doubly prevent hydrogen from being diffused toward the first transistor 130. Therefore, the quality of the display device 100 may be further improved.

The first hydrogen blocking layer 161 may directly contact and be electrically connected to the bottom surface of the first electrode 171. In addition, the first hydrogen blocking layer 161 may electrically connect the light-emitting element 170 and the first transistor 130 through the contact hole CH of the first overcoating layer 150. Therefore, the electrical connection between the light-emitting element 170 and the first transistor 130 may be maintained by the first hydrogen blocking layer 161 even though a partial area of the first electrode 171 is disconnected at the time of patterning the first electrode 171.

Specifically, as illustrated in FIG. 2, the first electrode 171 has a relatively larger area in a region corresponding to the light-emitting area of the subpixel SP, and has a relatively smaller area in a region corresponding to the contact hole CH for connection with the first transistor 130. Therefore, there is a likelihood that the disconnection occurs in the region of the first electrode 171 having a relatively smaller area or occurs on a boundary between the region having a relatively smaller area and the region having a relatively larger area during the patterning of the first electrode 171. In this case, the first electrode 171 and the first hydrogen blocking layer 161 may be etched through different processes. Therefore, even though a partial area of the first electrode 171 is disconnected during a process of etching the first electrode 171, the first hydrogen blocking layer 161 disposed at the lower portion of the first electrode 171 is not etched by an etchant used at the time of etching the first electrode 171. That is, the first hydrogen blocking layer 161 may maintain the electrical connection even though the first electrode 171 is disconnected. Therefore, it is possible to prevent a dark defect of the display device 100 that may occur when the first electrode 171 is disconnected.

The first hydrogen blocking layer 161 may be patterned for each of the plurality of subpixels SP. Therefore, the respective first electrodes 171 of the plurality of subpixels SP may be kept electrically insulated from each other. In addition, the respective first hydrogen blocking layers 161 disposed in the plurality of subpixels SP are spaced apart from each other, the first overcoating layer 150 may have an area exposed without being covered by the first hydrogen blocking layer 161. Therefore, it is possible to easily discharge fume which is gas produced during the process of forming the overcoating layers 114 and 150.

The first hydrogen blocking layer 161 may be used as a hard mask for forming the base portion 151 and the protruding portion 152. Therefore, the base portion 151 and the protruding portion 152 are integrated by a single organic material layer, which may reduce material costs and simplify the process. This configuration will be specifically described with reference to FIGS. 4A to 4D.

FIGS. 4A to 4D are cross-sectional views sequentially illustrating a method of manufacturing the display device according to the aspect of the present disclosure.

Figure 4A:
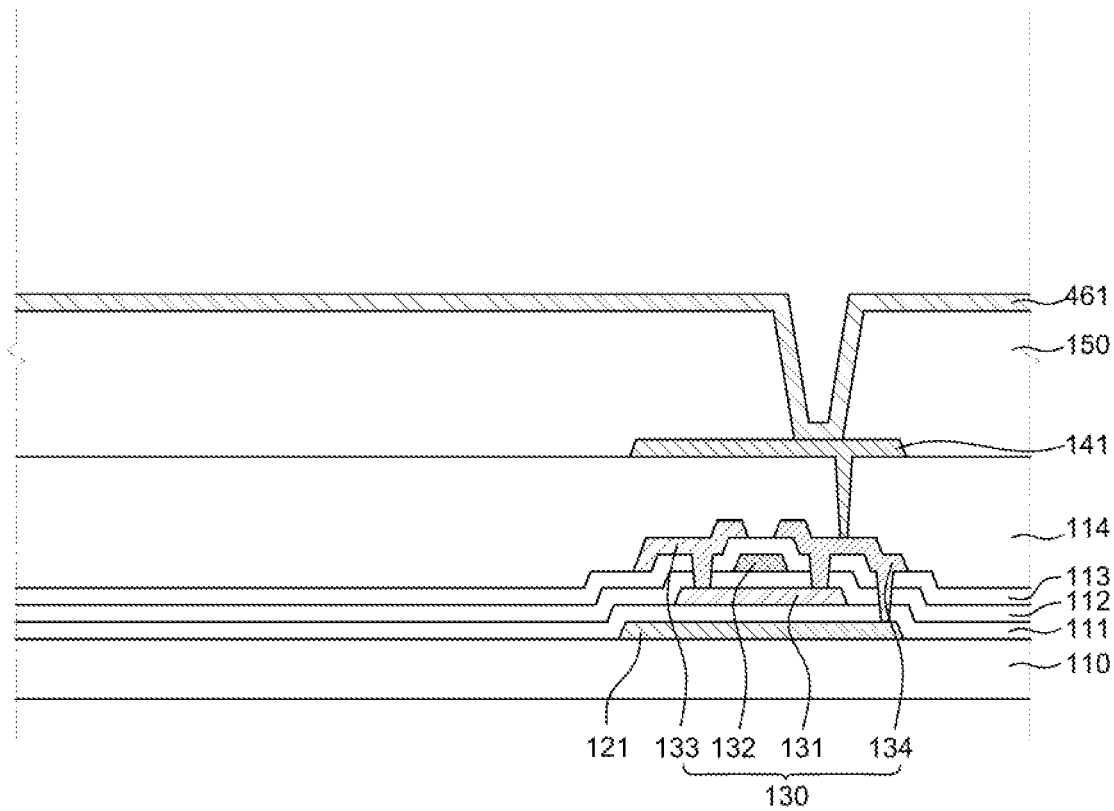
FIGS. 4A to 4D are cross-sectional views sequentially illustrating a method of manufacturing the display device according to the aspect of the present disclosure.

Referring to FIG. 4A, the protective layer 121, the buffer layer 111, the first transistor 130, the gate insulating layer 112, the interlayer insulating layer 113, the auxiliary electrode 141, the overcoating layers 114 and 150, and a metal layer 461 are formed on the substrate 110. In this case, the top surface of the first overcoating layer 150 may be parallel to the top surface of the substrate 110. The metal layer 461 may be deposited on the entire first overcoating layer 150 and electrically connected to the auxiliary electrode 141 through the contact hole CH of the first overcoating layer 150. The metal layer 461 may be made of titanium (Ti).

Figure 4B:
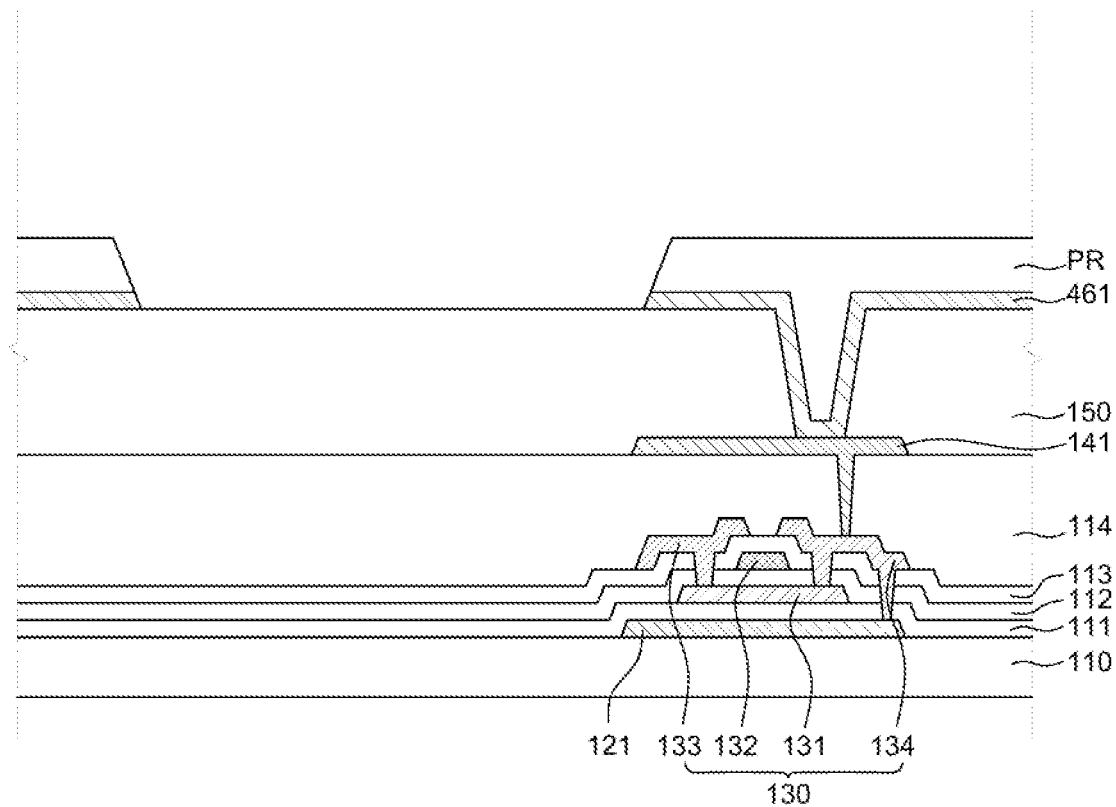

Referring to FIG. 4B, a photoresist PR is applied onto the metal layer 461, and a part of the metal layer 461 is removed by using the photoresist PR as a mask. In this case, an area from which the metal layer 461 is removed may be an area in which the top surface of the base portion 151 is exposed later.

Figure 4C:
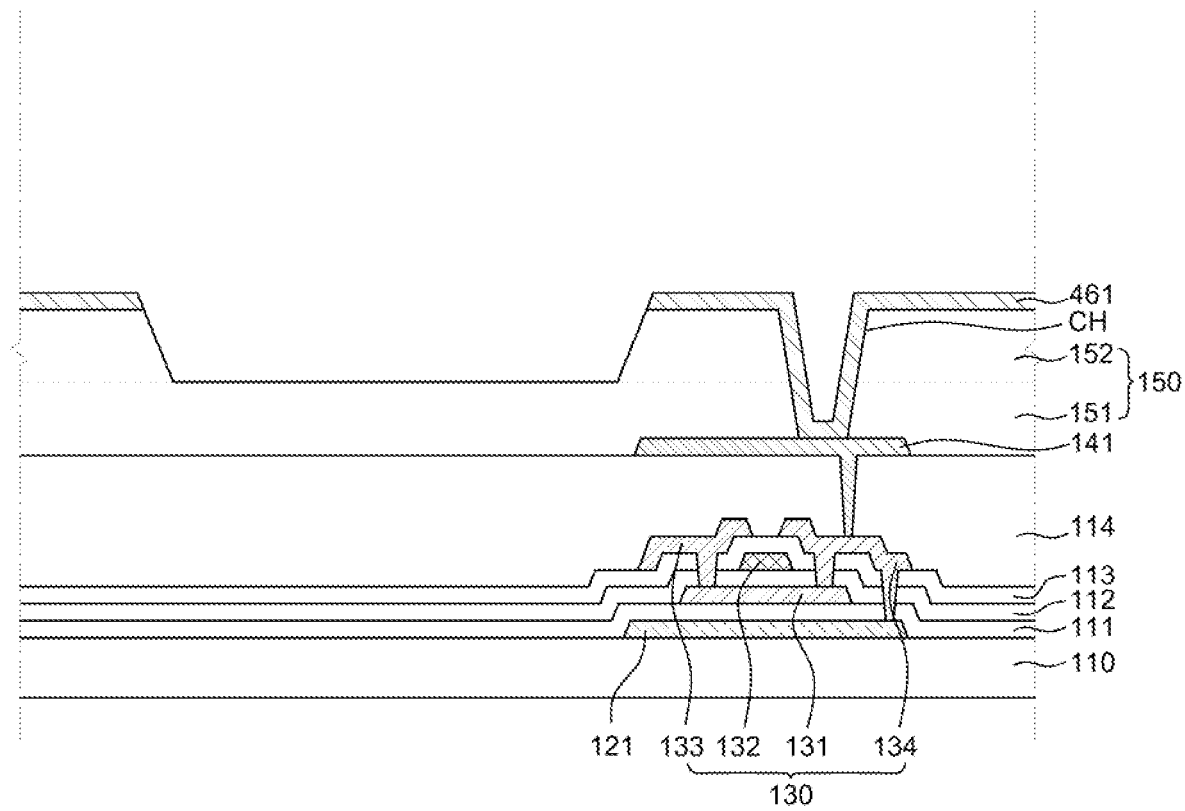

Referring to FIG. 4C, the photoresist PR is removed through an ashing process using oxygen (O2). In this case, a part of the first overcoating layer 150 may also be removed at the same time when the photoresist PR is removed. Specifically, a part of the first overcoating layer 150 may be etched together with the photoresist PR by using the metal layer 461 as a hard mask during the ashing process. In other words, a part of the first overcoating layer 150 exposed by the metal layer 461 may be removed by the ashing process. An area from which the first overcoating layer 150 is removed may have a shape concave from the top surface of the first overcoating layer 150. In addition, a lateral portion adjacent to the area from which the first overcoating layer 150 is removed may have a protruding shape. That is, the ashing process may configure the first overcoating layer 150 including the base portion 151 and the protruding portion 152 protruding from the base portion 151.

Figure 4D:
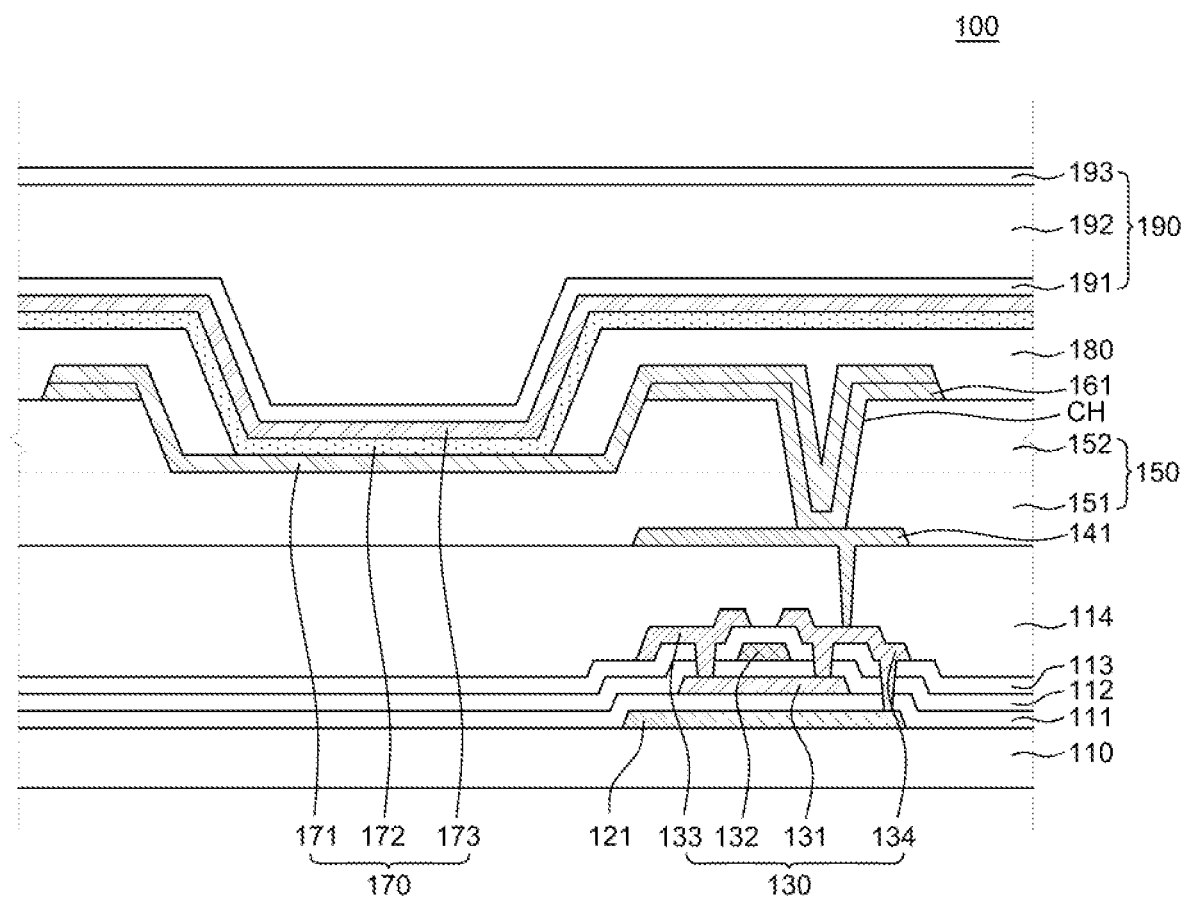

Referring to FIG. 4D, the light-emitting element 170, the bank 180, and the encapsulation unit 190 are formed on the first overcoating layer 150. Specifically, the first electrode 171 is formed on the exposed top surface of the base portion 151, the exposed side surface of the protruding portion 152, and the exposed top surface of the metal layer 461. In this case, the first electrode 171 may be formed on the entire surface of the substrate 110. Thereafter, the metal layer 461 and the first electrode 171 may be patterned to correspond to each of the plurality of subpixels SP. Therefore, the first hydrogen blocking layer 161 and the first electrode 171 may be separated for each of the plurality of subpixels SP. Meanwhile, the configuration has been described in which the metal layer 461 is patterned after the first electrode 171 is formed. However, the present disclosure is not limited thereto. That is, the metal layer 461 may be patterned before the first electrode 171 is formed. The bank 180, the organic layer 172, the second electrode 173, and the encapsulation unit 190 are formed after the first hydrogen blocking layer 161 and the first electrode 171 are formed.

The first hydrogen blocking layer 161 may be disposed on the top surface of the protruding portion 152 and surround the concave area of the first overcoating layer 150. That is, the concave area of the first overcoating layer 150 is formed by removing a part of the first overcoating layer 150 by using the first hydrogen blocking layer 161 as a mask. Therefore, the first hydrogen blocking layer 161 is disposed only on the top surface of the protruding portion 152. The first hydrogen blocking layer 161 is not disposed on the top surface of the base portion 151 and the side surface of the protruding portion 152. In addition, the first hydrogen blocking layer 161 may be provided along the edge of the first electrode 171 and disposed only at the lower portion of the first electrode 171. Therefore, the display device 100 according to the aspect of the present disclosure may further include only the first hydrogen blocking layer 161 without changing the whole structure thereof, thereby degradation of the first transistor 130 may be prevented.

The first hydrogen blocking layer 161 may serve to block hydrogen and be used as a mask for etching the first overcoating layer 150. That is, the concave area may be formed by removing a part of the first overcoating layer 150 through the first hydrogen blocking layer 161. The light-emitting element 170 is disposed in the concave area of the first overcoating layer 150. In particular, the first electrode 171 may be disposed along a shape of the concave area. Therefore, the first electrode 171 may include an inclined surface disposed along the side surface of the concave area, i.e., the side surface of the protruding portion 152. The light, which is emitted from the light-emitting element 170 and propagates laterally, may be extracted forward by being reflected by the inclined surface of the first electrode 171. Therefore, light extraction efficiency of the display device 100 may be improved.

According to the display device 100 according to the aspect of the present disclosure, the base portion 151 and the protruding portion 152 of the first overcoating layer 150 may be formed from the single organic material layer. That is, a material layer for forming the base portion 151 and a material layer for forming the protruding portion 152 are formed from the single layer without being separately formed. Specifically, the protruding portion 152 may have a protruding shape on the base portion 151 of the first overcoating layer 150 by removing a part of the first overcoating layer 150 by using the first hydrogen blocking layer 161 as a mask. Therefore, it is not necessary to separately form organic layers for forming the base portion 151 and the protruding portion 152. Therefore, it is possible to reduce the material costs and simplify the manufacturing process.

Figure 5:
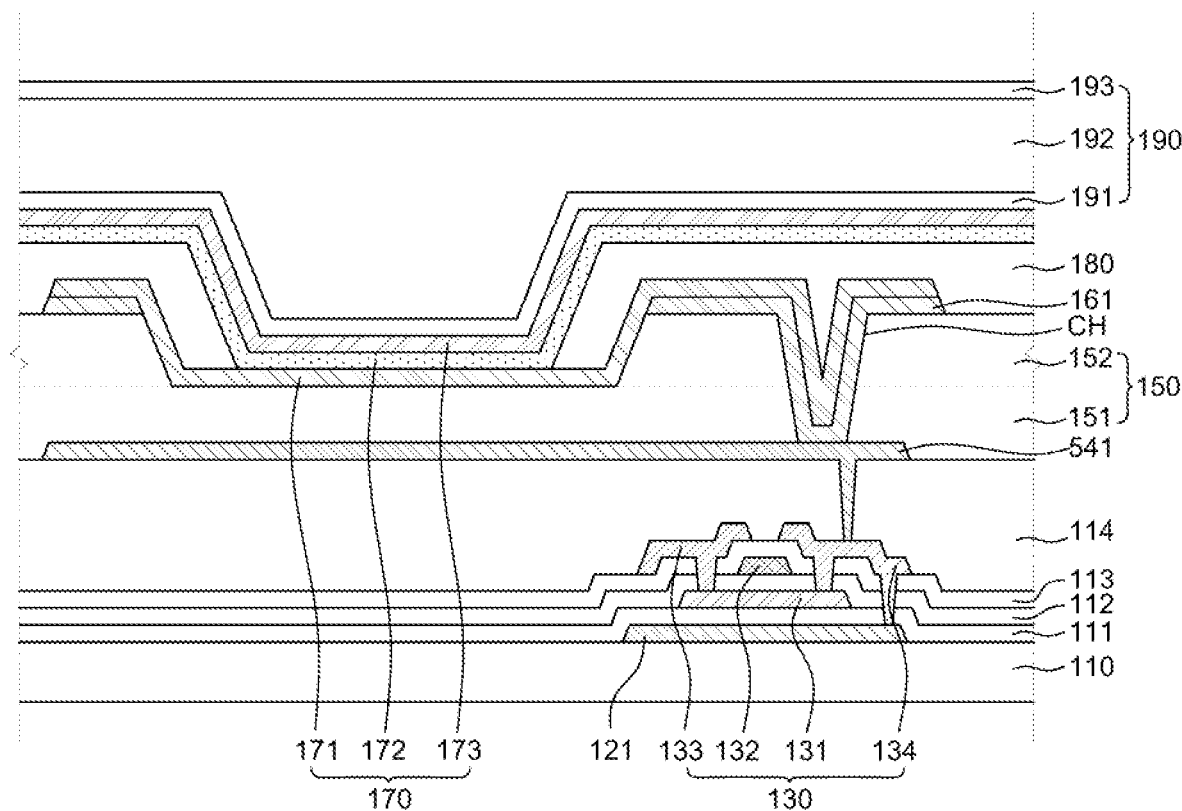
FIGS. 5 to 8 are views illustrating display devices according to various aspects of the present disclosure.

FIG. 5 is a cross-sectional view of a display device according to another aspect of the present disclosure. A display device 500 illustrated in FIG. 5 is substantially identical to the display device 100 illustrated in FIGS. 1 to 4D except for an auxiliary electrode 541. Therefore, repeated descriptions of the identical components will be omitted.

Referring to FIG. 5, the auxiliary electrode 541 is provided between the first overcoating layer 150 and the second overcoating layer 114 and disposed to completely overlap the first transistor 130. In addition, the auxiliary electrode 541 may extend to an area in which the auxiliary electrode 541 overlaps the light-emitting element 170. The auxiliary electrode 541 may be configured as a single layer or multilayer made of any one of molybdenum (Mo), copper (Cu), titanium (Ti), aluminum (Al), chromium (Cr), gold (Au), nickel (Ni), neodymium (Nd), and an alloy thereof. In particular, the auxiliary electrode 541 may be made of titanium having hydrogen trapping properties. Therefore, the auxiliary electrode 541 may serve as a hydrogen blocking layer while serving as an auxiliary electrode for connecting the first transistor 130 and the light-emitting element 170.

According to the display device 500 according to the aspect of the present disclosure, the auxiliary electrode 541 may be made of titanium and serve as a hydrogen blocking layer. That is, the display device 500 includes not only the first hydrogen blocking layer 161 but also the auxiliary electrode 541 which is a second hydrogen blocking layer. Therefore, a double structure of the hydrogen blocking layers may be formed between the encapsulation unit 190 and the first transistor 130, thereby the effect of blocking hydrogen may be further improved.

In particular, the auxiliary electrode 541 may completely overlap the first transistor 130. Therefore, the auxiliary electrode 541 may block the movement of hydrogen from the encapsulation unit 190 toward the first transistor 130. In addition, the auxiliary electrode 541 may extend from an area in which the auxiliary electrode 541 overlaps the first transistor 130 to an area in which the auxiliary electrode 541 overlaps the light-emitting element 170. Therefore, even though hydrogen is diffused in the horizontal direction along the first overcoating layer 150, the auxiliary electrode 541 may minimize the diffusion of hydrogen from the first overcoating layer 150 to the second overcoating layer 114. Therefore, it is possible to more effectively prevent degradation of the first transistor 130.

According to the display device 500 according to the aspect of the present disclosure, an overall resistance may be reduced by the auxiliary electrode 541. Specifically, the auxiliary electrode 541 electrically connects the first transistor 130 and the light-emitting element 170. In this case, since the auxiliary electrode 541 overlaps both the first transistor 130 and the light-emitting element 170, an area of the auxiliary electrode 541 may increase. Therefore, the resistance of the display device 500 may be reduced, thereby electric power consumption may be improved.

Figure 6:
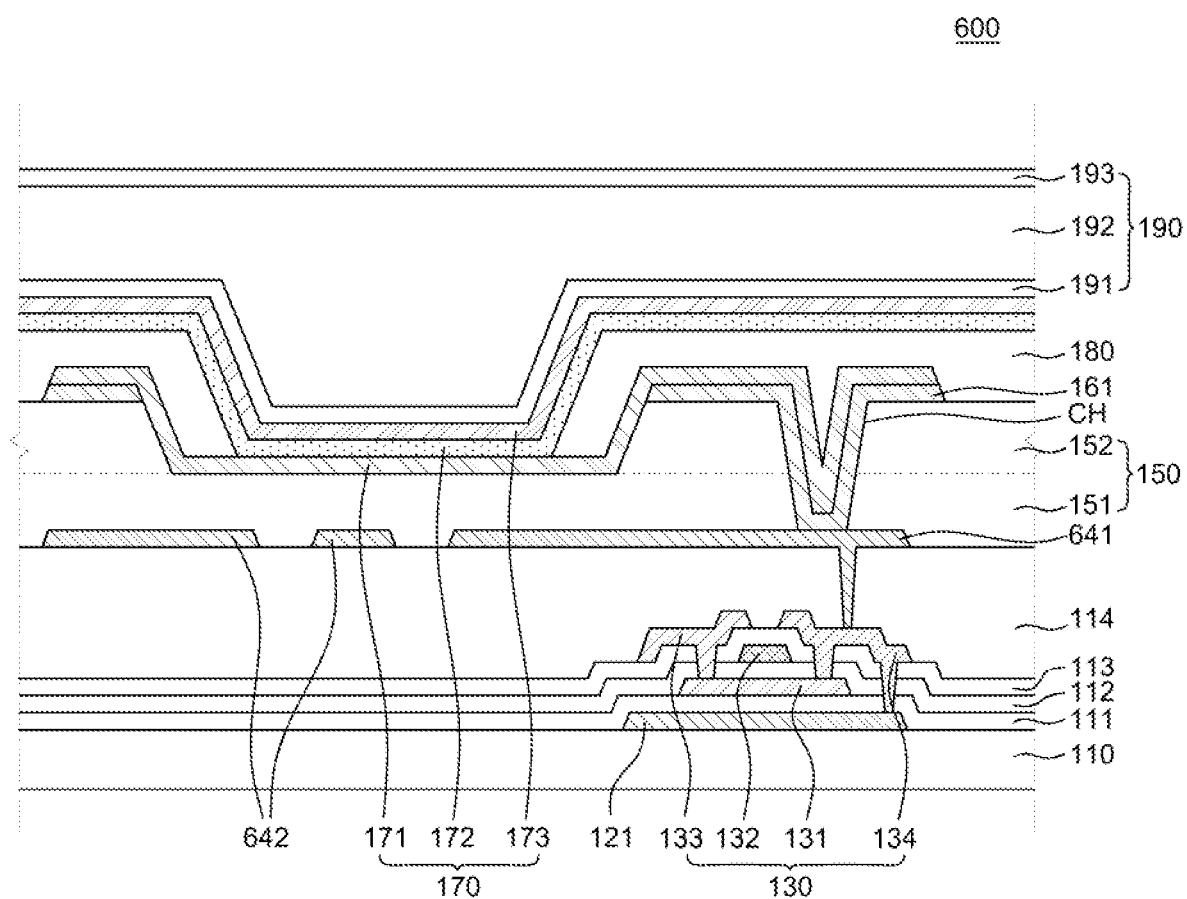

FIG. 6 is a cross-sectional view of a display device according to still another aspect of the present disclosure. A display device 600 illustrated in FIG. 6 is substantially identical to the display device 500 illustrated in FIG. 5 except for auxiliary electrodes 641 and 642. Therefore, repeated descriptions of the identical components will be omitted.

Referring to FIG. 6, the auxiliary electrodes 641 and 642 are disposed between the first overcoating layer 150 and the second overcoating layer 114. The auxiliary electrodes 641 and 642 may be made of titanium and serve as the second hydrogen blocking layers. In this case, the auxiliary electrodes 641 and 642 may be configured as a plurality of sub-hydrogen blocking layers. Specifically, the auxiliary electrodes 641 and 642 may include a first sub-hydrogen blocking layer 641 and second sub-hydrogen blocking layers 642.

The first sub-hydrogen blocking layer 641 electrically connects the first transistor 130 and the light-emitting element 170. That is, the first sub-hydrogen blocking layer 641 may substantially serve as an auxiliary electrode. The first sub-hydrogen blocking layer 641 may be disposed to completely overlap the first transistor 130, thereby diffusion of hydrogen to the first transistor 130 may be prevented.

The second sub-hydrogen blocking layers 642 are spaced apart from the first sub-hydrogen blocking layer 641. In addition, the second sub-hydrogen blocking layer 642 may be provided in plural, and the plurality of second sub-hydrogen blocking layers 642 may be spaced apart from each other. FIG. 6 illustrates two second sub-hydrogen blocking layers 642. However, the present disclosure is not limited thereto.

All the first sub-hydrogen blocking layer 641 and the plurality of second sub-hydrogen blocking layers 642 are spaced apart from each other while having separation spaces. The separation spaces may define areas that are disposed between the first overcoating layer 150 and the second overcoating layer 114 and exposed without being covered by the first and second sub-hydrogen blocking layers 641 and 642. In particular, an aperture ratio of the exposed area may be at least 30% or more. Therefore, it is possible to easily discharge fume produced during the processes of forming the overcoating layers 114 and 150. In addition, it is possible to minimize the degradation of the organic layer 172 and the separation between layers of the display device 600 caused by fume, thereby the reliability of the display device 600 may be improved.

According to the display device 600 according to the aspect of the present disclosure, the auxiliary electrode 641 may be made of titanium and serve as a hydrogen blocking layer. Therefore, a double structure of the hydrogen blocking layers may be formed between the encapsulation unit 190 and the first transistor 130, thereby the effect of blocking hydrogen may be further improved. In particular, the auxiliary electrodes include the first sub-hydrogen blocking layer 641 and the second sub-hydrogen blocking layers 642 which are spaced apart from each other. Therefore, it is possible to ensure the function of blocking hydrogen and easily discharge the fume, thereby the quality of the display device 600 may be further improved.

In addition, the first sub-hydrogen blocking layer 641 and the second sub-hydrogen blocking layers 642 are spaced apart from each other and electrically insulated. Therefore, the first sub-hydrogen blocking layer 641 and the second sub-hydrogen blocking layers 642 may serve as different auxiliary electrodes or wires, thereby constraints on wiring design may be reduced.

Figure 7:
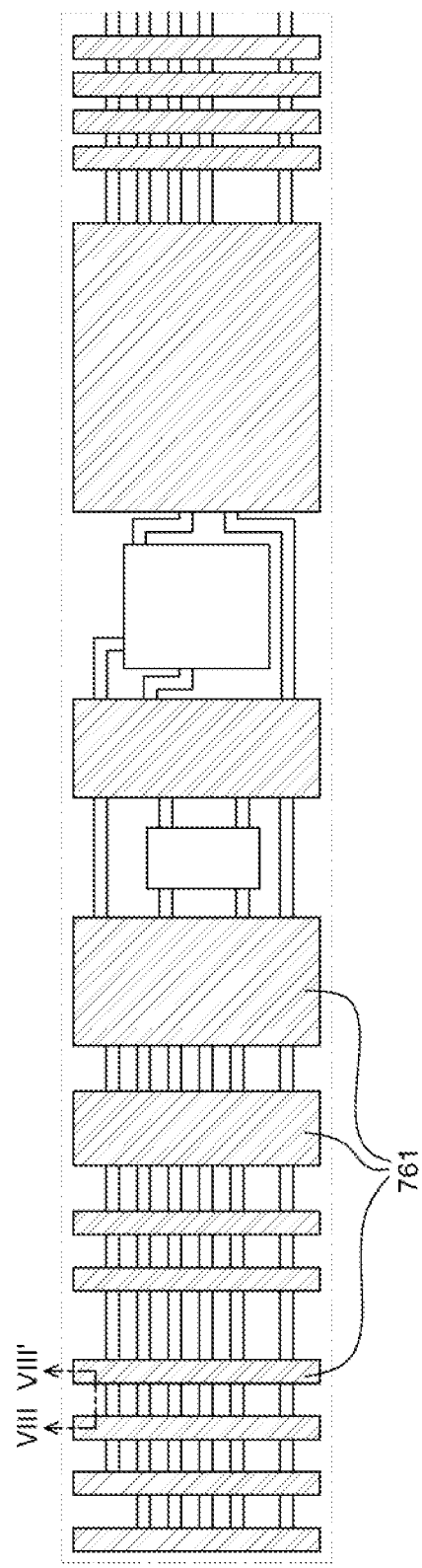
Figure 8:
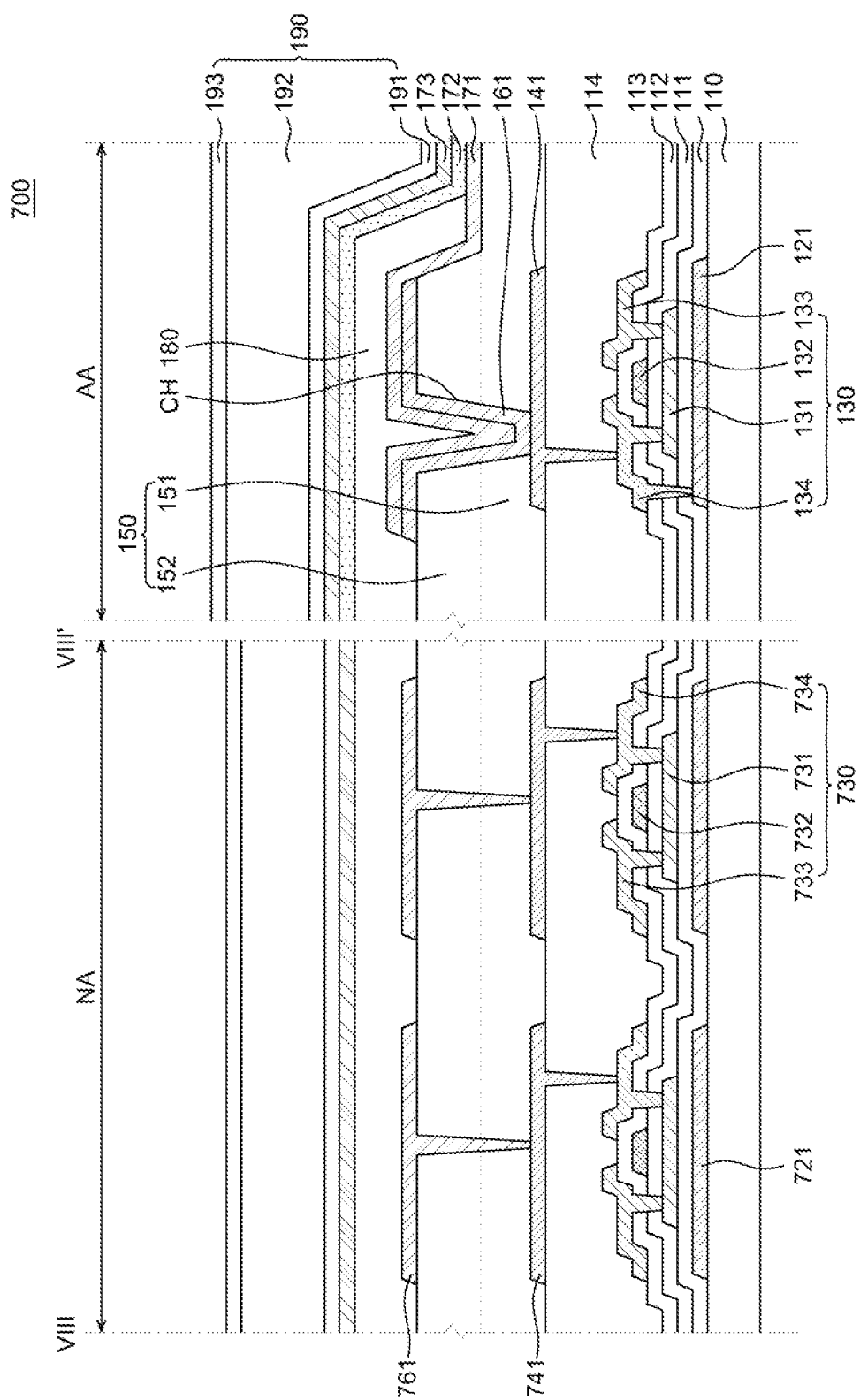

FIG. 7 is a top plan view of a display device according to still yet another aspect of the present disclosure. FIG. 8 is a cross-sectional view of the display device taken along line VIII-VIII' in FIG. 7. FIG. 7 is a top plan view schematically illustrating a display device 700 corresponding to a part of the non-display area NA in FIG. 1. FIG. 7 schematically illustrates only a third hydrogen blocking layer 761 disposed in the non-display area NA. The display device 700 illustrated in FIGS. 7 and 8 is substantially identical to the display device 100 illustrated in FIGS. 1 to 4D except for the non-display area NA. Therefore, repeated descriptions of the identical components will be omitted.

Referring to FIGS. 7 and 8, the display device 700 includes a protective layer 721, a plurality of transistors 130 and 730, auxiliary electrodes 141 and 741, the first hydrogen blocking layer 161, and the third hydrogen blocking layer 761.

The plurality of transistors 130 and 730 include the first transistor 130 and a second transistor 730. The first transistor 130 may be a driving transistor disposed in the display area AA and electrically connected to the light-emitting element 170 disposed in each of the plurality of subpixels SP. The second transistor 730 may be a transistor included in the drive IC disposed in the non-display area NA. For example, the second transistor 730 may be a constituent element of a gate driver. The gate driver may be implemented in a gate-in-panel (GIP) manner. However, the present disclosure is not limited thereto. In addition, FIG. 7 illustrates one of a plurality of stages included in the gate driver. The plurality of stages may be electrically connected to the plurality of subpixels SP through a plurality of gate lines.

The second transistor 730 includes an active layer 731, a gate electrode 732, a source electrode 733, and a drain electrode 734. In this case, the active layer 731, the gate electrode 732, the source electrode 733, and the drain electrode 734 of the second transistor 730 may be made of the same materials and formed through the same processes as the active layer 131, the gate electrode 132, the source electrode 133, and the drain electrode 134 of the first transistor 130. That is, the active layer 731 of the second transistor 730 may be made of an oxide semiconductor. FIG. 8 illustrates only the second transistor 730 made of the oxide semiconductor disposed in the non-display area NA. However, the non-display area NA may also include an LTPS thin-film transistor.

The protective layer 721 is disposed at a lower portion of the second transistor 730 in the non-display area NA. The protective layer 721 may be disposed to overlap the second transistor 730 and protect the second transistor 730. The protective layer 721 may be made of the same material and formed through the same process as the protective layer 121 in the display area AA.

The auxiliary electrode 741 is disposed above the second transistor 730 in the non-display area NA. Specifically, the auxiliary electrode 741 may be provided between the second overcoating layer 114 and the first overcoating layer 150 and disposed to completely overlap the second transistor 730. In addition, the auxiliary electrode 741 may be electrically connected to the drain electrode 734 of the second transistor 730. The auxiliary electrode 741 may be configured as a single layer or multilayer made of any one of molybdenum (Mo), copper (Cu), titanium (Ti), aluminum (Al), chromium (Cr), gold (Au), nickel (Ni), neodymium (Nd), and an alloy thereof. In particular, the auxiliary electrode 741 may be made of titanium having hydrogen trapping properties. Therefore, the auxiliary electrode 741 may serve as the second hydrogen blocking layer while serving as an auxiliary electrode for connecting the second transistor 730 and the third hydrogen blocking layer 761. The auxiliary electrode 741 may be made of the same material and formed through the same process as the auxiliary electrode 141 in the display area AA.

The third hydrogen blocking layer 761 is provided on the first overcoating layer 150 in the non-display area NA and disposed to overlap the second transistor 730. In addition, the third hydrogen blocking layer 761 may be electrically connected to the second transistor 730 through the auxiliary electrode 741. The third hydrogen blocking layer 761 may be made of titanium. The third hydrogen blocking layer 761 may be made of the same material and formed through the same process as the first hydrogen blocking layer 161.

According to the display device 700 according to the aspect of the present disclosure, the third hydrogen blocking layer 761 is also disposed in the non-display area NA. In this case, the third hydrogen blocking layer 761 may be disposed to overlap the second transistor 730. That is, as illustrated in FIG. 7, the second transistor 730 in the non-display area NA may be covered by the third hydrogen blocking layer 761. Therefore, it is possible to prevent hydrogen produced from the encapsulation unit 190 from being diffused to the second transistor 730 disposed in the non-display area NA.

In addition, the auxiliary electrode 741, which is the second hydrogen blocking layer, may be disposed between the third hydrogen blocking layer 763 and the second transistor 730. In this case, the auxiliary electrode 741 may be disposed to overlap the second transistor 730. Therefore, a double structure of the hydrogen blocking layers may be formed between the encapsulation unit 190 and the second transistor 730, thereby the effect of blocking hydrogen may be further improved.

The auxiliary electrode 741 and the third hydrogen blocking layer 761 may be patterned to correspond to each of the plurality of second transistors 730 disposed in the non-display area NA. That is, a plurality of auxiliary electrodes 741 may be provided, a plurality of third hydrogen blocking layers 761 may be provided, and the plurality of auxiliary electrodes 741 and the plurality of third hydrogen blocking layers 761 may respectively overlap the plurality of second transistors 730. In addition, the plurality of auxiliary electrodes 741 may be spaced apart from each other. The plurality of third hydrogen blocking layers 761 may be spaced apart from each other. Therefore, the first overcoating layer 150 and the second overcoating layer 114 may each include an area exposed without being covered by the auxiliary electrode 741 and the third hydrogen blocking layer 761. Therefore, it is possible to easily discharge fume produced at the time of forming the overcoating layers 114 and 150. In addition, it is possible to minimize the degradation of the organic layer 172 and the separation between layers of the display device 700 caused by fume, thereby the reliability of the display device 700 may be improved.

The auxiliary electrode 741 and the third hydrogen blocking layer 761 may be electrically connected to the second transistor 730. Specifically, the second transistor 730 may be electrically connected to the third hydrogen blocking layer 761 through the auxiliary electrode 741. Therefore, the resistance may be reduced, thereby electric power consumption may be improved.

The exemplary aspects of the present disclosure can also be described as follows:

According to an aspect of the present disclosure, a display device includes: a substrate including a display area and a non-display area; a first overcoating layer on the substrate and including a base portion and a protruding portion protruding from the base portion; a first hydrogen blocking layer on a top surface of the protruding portion in the display area; a first electrode covering the base portion and the first hydrogen blocking layer; a bank on a part of the first electrode; an organic layer on the first electrode and the bank; and a second electrode on the organic layer.

The base portion may include an exposed area exposed by the protruding portion. The first hydrogen blocking layer may be disposed to surround the exposed area.

The first hydrogen blocking layer may be disposed in a shape of a closed loop so as to contact an edge of the first electrode.

The first hydrogen blocking layer may be made of titanium (Ti).

The display device may further include a transistor under the first overcoating layer in the display area. The transistor may be electrically connected to the first electrode by the first hydrogen blocking layer.

The first electrode may include a reflective layer and a transparent conductive layer on the reflective layer.

The display device may further include: a transistor disposed under first overcoating layer; a second overcoating layer between the transistor and the first overcoating layer; and a second hydrogen blocking layer between the first overcoating layer and the second overcoating layer.

The second hydrogen blocking layer may be made of titanium (Ti).

The second hydrogen blocking layer may include a plurality of sub-hydrogen blocking layers spaced apart from each other.

The transistor may be disposed in the display area. The second hydrogen blocking layer may be disposed to overlap the transistor.

The transistor may be disposed in the non-display area. The second hydrogen blocking layer may be disposed to overlap the transistor.

The second hydrogen blocking layer may be connected to one of a source electrode and a drain electrode of the transistor.

The display device may further include: a transistor under the first overcoating layer in the non-display area; and a third hydrogen blocking layer on the first overcoating layer and overlapping the transistor.

The third hydrogen blocking layer may be disposed on a same layer and made of a same material as the first hydrogen blocking layer.

The display device may further include a transistor under the first overcoating layer in the display area. An active layer of the transistor may be made of an oxide semiconductor.

The display device may further include an encapsulation unit disposed on the second electrode.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device comprising:
   a substrate including a display area and a non-display area;
   a first overcoating layer disposed on the substrate and including a base portion and a protruding portion protruding from the base portion;
   a first hydrogen blocking layer disposed on a top surface of the protruding portion in the display area;
   a first electrode covering the base portion and the first hydrogen blocking layer;
   a bank disposed on a part of the first electrode;
   an organic layer disposed on the first electrode and the bank; and
   a second electrode disposed on the organic layer,
   wherein the first hydrogen blocking layer is not disposed on a top surface of the base portion and a side surface of the protruding portion.

2. The display device of claim 1, wherein the base portion includes an exposed area exposed by the protruding portion, and
   wherein the first hydrogen blocking layer surrounds the exposed area.

3. The display device of claim 1, wherein the first hydrogen blocking layer is disposed in a shape of a closed loop and contacts an edge of the first electrode.

4. The display device of claim 1, wherein the first hydrogen blocking layer is made of titanium (Ti).

5. The display device of claim 1, further comprising a transistor disposed under the first overcoating layer in the display area,
   wherein the transistor is electrically connected to the first electrode by the first hydrogen blocking layer.

6. The display device of claim 1, wherein the first electrode includes a reflective layer and a transparent conductive layer disposed on the reflective layer.

7. The display device of claim 1, further comprising:
   a transistor disposed under the first overcoating layer;
   a second overcoating layer disposed between the transistor and the first overcoating layer; and
   a second hydrogen blocking layer disposed between the first overcoating layer and the second overcoating layer.

8. The display device of claim 7, wherein the second hydrogen blocking layer is made of titanium (Ti).

9. The display device of claim 7, wherein the second hydrogen blocking layer includes a plurality of sub-hydrogen blocking layers spaced apart from each other.

10. The display device of claim 7, wherein the transistor is disposed in the display area, and
    wherein the second hydrogen blocking layer overlaps with the transistor.

11. The display device of claim 7, wherein the transistor is disposed in the non- display area, and
    wherein the second hydrogen blocking layer overlaps with the transistor.

12. The display device of claim 7, wherein the second hydrogen blocking layer is connected to one of a source electrode and a drain electrode of the transistor.

13. The display device of claim 1, further comprising:
a transistor disposed under the first overcoating layer in the non-display area; and
a third hydrogen blocking layer on the first overcoating layer and overlapping with the transistor.

14. The display device of claim 13, wherein the third hydrogen blocking layer is disposed on a same layer and made of a same material as the first hydrogen blocking layer.

15. The display device of claim 1, further comprising a transistor disposed under the first overcoating layer in the display area,
wherein an active layer of the transistor is made of an oxide semiconductor.

16. The display device of claim 1, further comprising:
an encapsulation unit disposed on the second electrode.

17. A display device comprising:
a substrate including a display area and a non-display area;
a first overcoating layer disposed on the substrate and including a base portion and a protruding portion protruding from the base portion;
a first hydrogen blocking layer disposed on a top surface of the protruding portion in the display area;
a first electrode covering the base portion and the first hydrogen blocking layer;
a bank disposed on a part of the first electrode;
an organic layer disposed on the first electrode and the bank; and
a second electrode disposed on the organic layer,
wherein the first electrode is in contact with a side surface of the first hydrogen blocking layer on the top surface of the protruding portion.

18. The display device of claim 17, wherein the base portion includes an exposed area exposed by the protruding portion, and
wherein the first hydrogen blocking layer surrounds the exposed area.

19. The display device of claim 17, further comprising:
a transistor disposed under the first overcoating layer;
a second overcoating layer disposed between the transistor and the first overcoating layer; and
a second hydrogen blocking layer disposed between the first overcoating layer and the second overcoating layer.

20. The display device of claim 17, further comprising:
a transistor disposed under the first overcoating layer in the non-display area; and
a third hydrogen blocking layer on the first overcoating layer and overlapping with the transistor.

* * * * *